(12) United States Patent
Tan

(10) Patent No.: US 8,536,894 B1
(45) Date of Patent: Sep. 17, 2013

(54) OUTPUT DRIVER AND METHOD OF OPERATING THE SAME

(75) Inventor: Sing-Keng Tan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/525,582

(22) Filed: Jun. 18, 2012

Related U.S. Application Data

(62) Division of application No. 12/887,082, filed on Sep. 21, 2010, now Pat. No. 8,222,918.

(51) Int. Cl.
*H03K 17/16* (2006.01)

(52) U.S. Cl.
USPC .................................. 326/30; 326/83; 326/86

(58) Field of Classification Search
None
See application file for complete search history.

(56) References Cited

U.S. PATENT DOCUMENTS

| | | | |
|---|---|---|---|
| 6,339,318 B1 | 1/2002 | Tanaka | |
| 6,445,245 B1 | 9/2002 | Schultz et al. | |
| 6,489,837 B2 | 12/2002 | Schultz et al. | |
| 6,812,735 B1 * | 11/2004 | Pham | 326/30 |
| 7,109,744 B1 | 9/2006 | Shumarayev et al. | |
| 7,183,805 B2 | 2/2007 | Wang et al. | |
| 7,253,663 B2 | 8/2007 | Cho et al. | |
| 7,443,193 B1 | 10/2008 | Santurkar et al. | |
| 2003/0122593 A1 * | 7/2003 | Volk | 327/108 |
| 2008/0116943 A1 | 5/2008 | Nair | |
| 2009/0179682 A1 | 7/2009 | Khoury et al. | |
| 2009/0201047 A1 * | 8/2009 | Batt | 326/30 |

OTHER PUBLICATIONS

U.S. Appl. No. 12/887,082, filed Sep. 21, 2010, Tan.

* cited by examiner

*Primary Examiner* — Crystal L Hammond
(74) *Attorney, Agent, or Firm* — W. Eric Webostad; LeRoy D. Maunu

(57) ABSTRACT

In an integrated circuit for an output interface, a comparator is used to compare a reference voltage and a regulated voltage to provide a comparison output. A state machine is coupled to the comparator to increment or decrement a resistance setting output of the state machine responsive to the comparison output. A reference single-ended driver is coupled to receive the resistance setting output from the state machine. An output node of the reference single-ended driver is coupled to a reference node. From the reference node, the reference voltage is input to the comparator as a feedback voltage. Transistors of the reference single-ended driver are set to be in either at least a substantially conductive state or at least a substantially non-conductive state responsive to the resistance setting output to provide an internal source termination resistance as a reference resistance.

20 Claims, 9 Drawing Sheets

OUTPUT DRIVER AND METHOD OF OPERATING THE SAME

CROSS-REFERENCE TO RELATED APPLICATIONS

This application is a divisional of U.S. patent application Ser. No. 12/887,082, filed Sep. 21, 2010, entitled "Output Driver and Method of Operating the Same" by Sing-Ken Tan, now pending.

FIELD OF THE INVENTION

The invention relates to integrated circuit devices ("ICs"). More particularly, the invention relates to an output driver for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

IOBs, such as in an FPGA, conventionally may be have single-ended output drivers, input buffers, and a differential output driver. Conventionally, such a differential output driver may be configured for "push-pull" or "open-drain" operation to support various differential output specifications.

As differential serial data rates increase, the transmission line effect becomes more prominent. Along those lines, even small impedance discontinuities with a transmission line may cause significant reflection, namely sufficient to negatively impact slew rate of a signal.

Accordingly, it would be desirable and useful to provide an output driver that is configurable to have less reflection.

SUMMARY

One or more embodiments generally relate to an output driver for an IC.

An embodiment relates generally to an integrated circuit for an output driver. In such an embodiment, a differential driver is coupled to a first single-ended driver at a first output node of the first single-ended driver and the differential driver. A second single-ended driver is coupled to the differential driver at a second output node of the second single-ended driver and the differential driver. The first single-ended driver provides a first source termination resistance for an open-drain mode of the differential driver, and the second single-ended driver provides a second source termination resistance for the open-drain mode of the differential driver.

Another embodiment relates generally to an integrated circuit for an output interface. In such an embodiment, a comparator is used to compare a reference voltage and a regulated voltage to provide a comparison output. A state machine is coupled to the comparator to increment or decrement a resistance setting output of the state machine responsive to the comparison output. A reference single-ended driver is coupled to receive the resistance setting output from the state machine. An output node of the reference single-ended driver is coupled to a reference node. From the reference node, the reference voltage is input to the comparator as a feedback voltage. Transistors of the reference single-ended driver are set to be in either at least a substantially conductive state or at least a substantially non-conductive state responsive to the resistance setting output to provide an internal source termination resistance as a reference resistance.

Yet another embodiment relates generally to a method of operating an output driver having a differential driver, a first single-ended driver, and a second single-ended driver, where the first single-ended driver is coupled to the differential driver at a first output node common to the first single-ended driver and the differential driver, and where the second single-ended driver is coupled to the differential driver at a second output node common to the second single-ended driver and the differential driver. In such an embodiment, the first single-ended driver and the second single-ended driver are set to provide a first source termination resistance and a second source termination resistance, respectively. The differential driver is put in an open-drain mode of differential transmission. For the open-drain mode for the differential transmission, the first single-ended driver is used for the first source termination resistance, and the second single-ended driver is used for the second source termination resistance.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
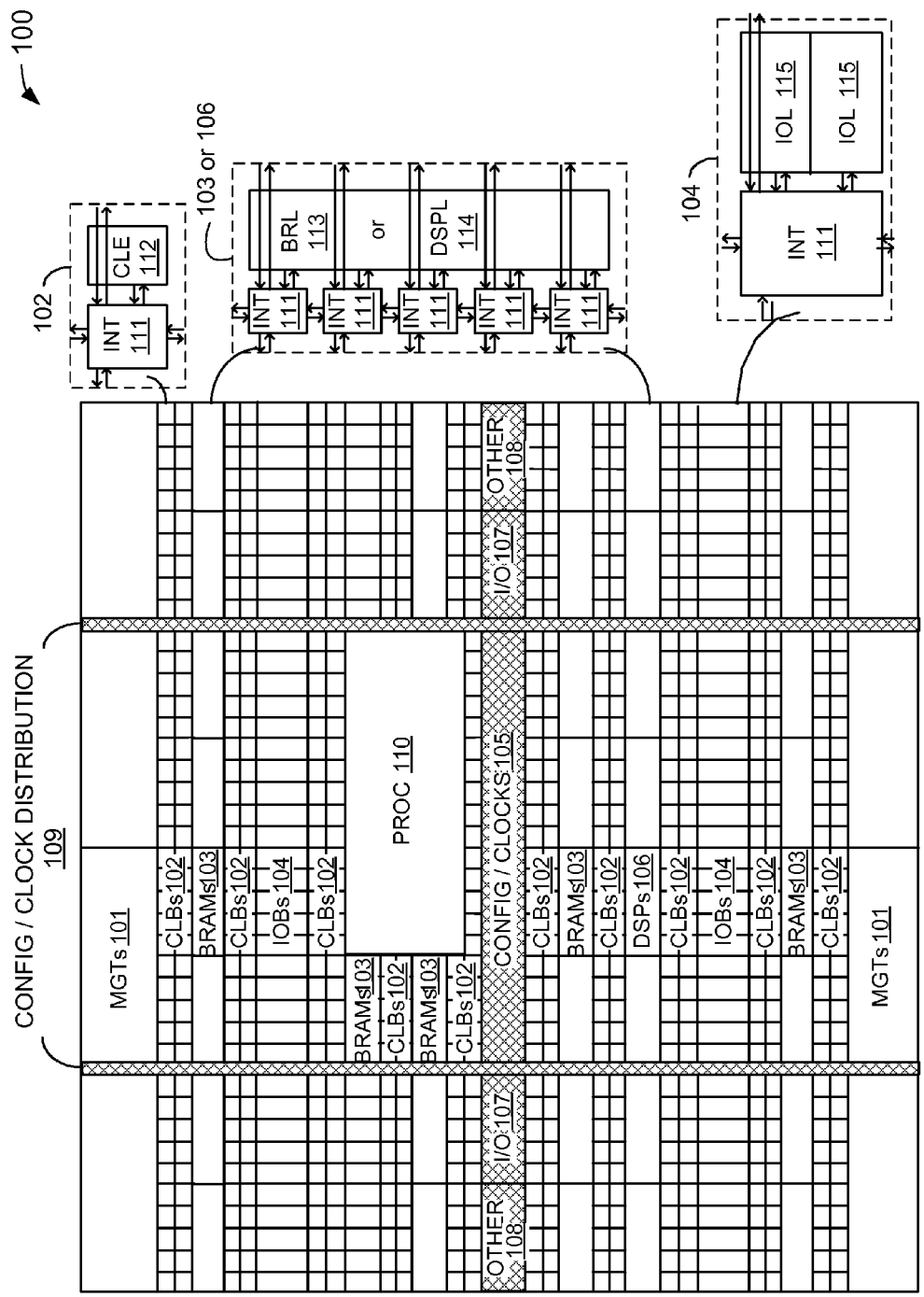
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
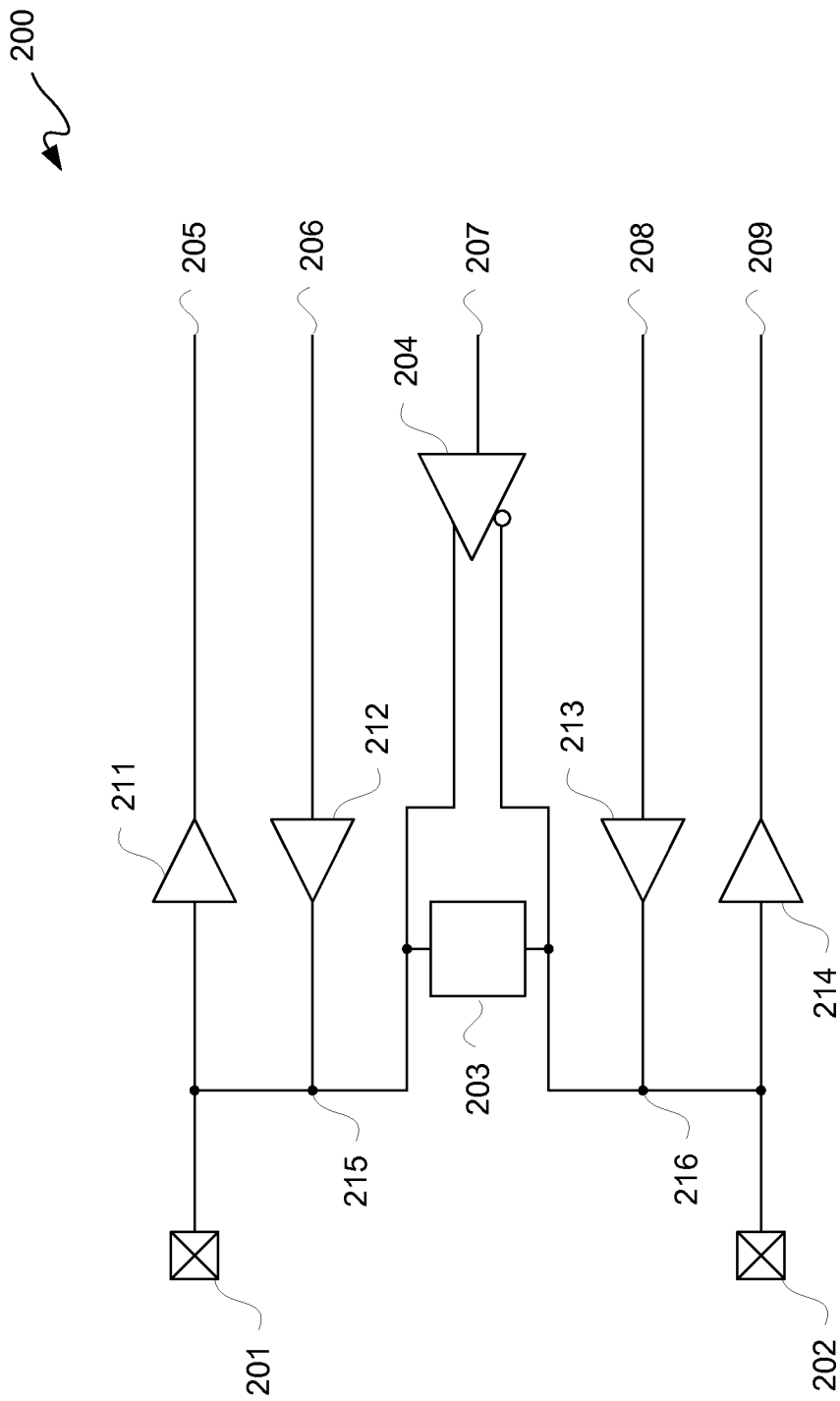
FIG. 2 is a block/circuit diagram depicting an exemplary embodiment of an input/output block.

FIG. 2 is a block/circuit diagram depicting an exemplary embodiment of an IOB 200. IOB 200 may be of any integrated circuit, including without limitation a PLD such as an FPGA, capable of differential serial transmission. IOB 200 includes I/O pads 201 and 202, input buffers 211 and 214, single-ended output drivers 212 and 213, differential driver 204, and termination impedance 203. Termination impedance 203 is configured to be used as source termination in a push-pull differential output driver mode, and as differential termination in a differential receiver mode. When IOB 200 is configured for differential output signaling, namely as a differential output driver, input buffers 211 and 214 are not used. Heretofore, single-ended output drivers 212 and 213 were not used when IOB was used for differential signaling. However, as described below in additional detail, single-ended output drivers 212 and 213 may be used not as drivers, but for trimming source termination impedance.

Termination impedance 203, which in this exemplary embodiment is on-chip, is coupled between output nodes 215 and 216, which output nodes are respectively coupled to I/O pads 201 and 202. As stated above, termination impedance 203 may be used in differential receiver mode or a push-pull differential output driver mode; however, termination impedance 203 is not used in an open-drain differential output driver mode.

As previously described, for relatively high transmission rates, such as 800 megabits per second ("Mbps") or more, even minor impedance discontinuities can cause significant reflection, negatively impacting slew rate of a transmitted signal. As described below in additional detail, single-ended output drivers 212 and 213, which are not in use as drivers when IOB 200 is in a differential output driver mode, may be used in an open-drain differential output driver mode to reduce or eliminate impedance discontinuities with respect to a transmission line effect. In other words, source termination impedance may be trimmed to reduce or eliminate reflection, and thus reduce or eliminate negative impact on slew rate of a transmitted signal caused by such reflection.

More particularly, it should be understood that by adjusting the source termination impedance to reduce impact of any reflection by minimizing a reflection coefficient for differential driver 204 in an open-drain mode, slew rate may be reduced. Furthermore, it should be understood that because single-ended output drivers 212 and 213 are already present within IOB 200, no additional die area for such on-chip source termination impedance is used, except as described below in additional detail with respect to a modicum of circuitry added for setting such single-ended output drivers 212 and 213 to provide respective source termination trimming resistances for differential driver 204.

Figure 3:
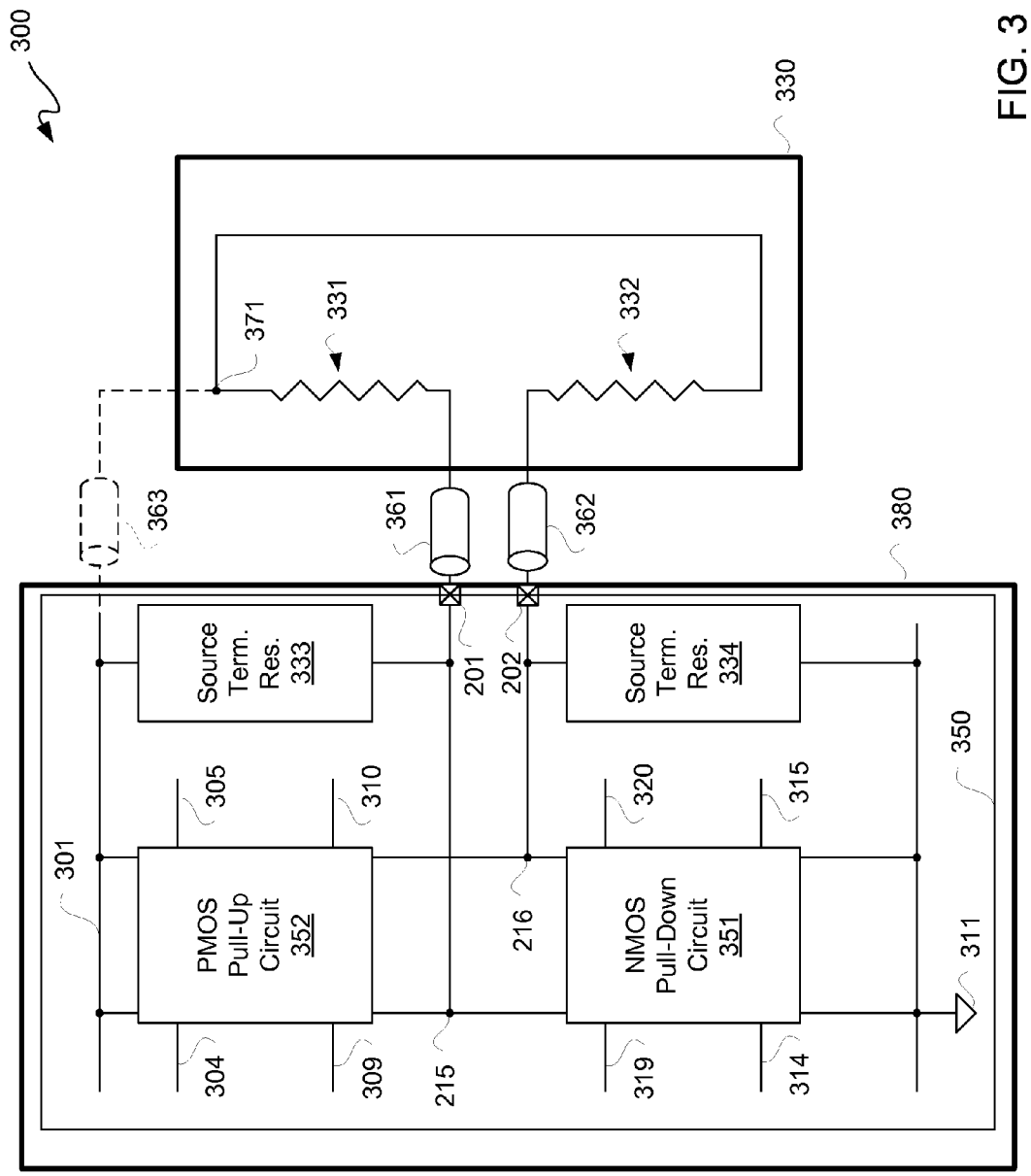
FIG. 3 is a block/circuit diagram depicting an exemplary embodiment of a transmission system.

FIG. 3 is a block/circuit diagram depicting an exemplary embodiment of a transmission system 300. Transmission system 300 includes integrated circuit 380 and integrated circuit 330. Integrated circuit 380 is configured for transmitting information to integrated circuit 330. Additionally, for clarity, the terms "impedance" and "resistance", as well as variations thereof, are used interchangeably. For purposes of clarity and not limitation, integrated circuit 380 includes a differential output driver 350; however, it should be understood that integrated circuit 380 may include circuitry other than differential output driver 350.

Differential output driver 350 may be differential driver 204 of FIG. 2, for example. Differential output driver 350 includes a PMOS pull-up circuit 352 and NMOS pull-down circuit 351, a source termination resistance 333, and a source termination resistance 334. PMOS pull-up circuit 352 may be coupled to a supply voltage bus 301, such as to provide a VCCO voltage or other supply voltage. Source termination resistance 333 may likewise be coupled to supply voltage bus 301. NMOS pull-down circuit 351 may be coupled to ground 311. Likewise, source termination resistance 334 may be coupled to ground 311. Separate ports of PMOS pull-up circuit 352 may be respectively coupled to output nodes 215 and 216. Likewise, separate ports of NMOS pull-down circuit 351 may be respectively coupled to output nodes 215 and 216. Source termination resistance 333 may be coupled to output node 215, and source termination resistance 334 may be coupled to output node 216.

NMOS pull-down circuit 351 receives n-bias signals 314 and 315, which may be the same signal. NMOS pull-down circuit 351 further receives a pair of complementary differential data signals 319 and 320. Differential data signals 319 and 320 are associated with a negative side ("N") of differential output driver 350.

PMOS pull-up circuit 352 receives p-bias signals 304 and 305, which may be the same signal. PMOS pull-up circuit 352 further receives a pair of complementary differential data signals 309 and 310. Data signals 309 and 310 are associated with a positive ("P") side of differential output driver 350.

In a transmission mode, output node 215 may be thought of as being associated with a pin P output pad 201, and output node 216 may be thought of as being associated with a pin N output pad 202.

Output nodes 215 and 216 may respectively be coupled to transmission lines 361 and 362 via pads 201 and 202. Such transmission lines 361 and 362 have respective impedances, which for purposes of clarity are assumed to be equivalent to one another. Transmission lines 361 and 362 may be respectively coupled to receiver termination resistances 331 and 332 of integrated circuit 330, which receiver termination resistances effectively may be coupled to one another at a node 371 of integrated circuit 330.

In a push-pull current mode, differential output driver 350 may communicate information to integrated circuit 330 via transmission lines 361 and 362, for example using a low voltage differential signaling ("LVDS") or other differential signaling. However, differential output driver 350 may operate in an open-drain current mode, namely either an NMOS open-drain current mode or a PMOS open-drain current mode, for providing differential signaling via transmission lines 361 and 362 to integrated circuit 330. Furthermore, optionally, node 371 of receiver integrated circuit 330 may be coupled to supply voltage bus 301 via transmission line 363 for Transition Minimized Differential Signaling ("TMDS"). TDMS is a high-speed serial data transmission configuration, which is currently used by DVI and HDMI video interfaces, as well as other digital communication interfaces. Transmission line 363 also has impedance.

The following description is directed at operating differential output driver 350 in an open-drain current mode, namely as an open-drain current mode driver. In such an open-drain current mode, differential driver 350 may be operated as an NMOS open-drain current mode driver or a PMOS open-drain current mode driver. For purposes of clarity by way of example and not limitation, differential output driver is generally described as operating in an NMOS open-drain current mode, as operation in a PMOS open-drain current mode will follow from the description of the former mode.

Figure 4:
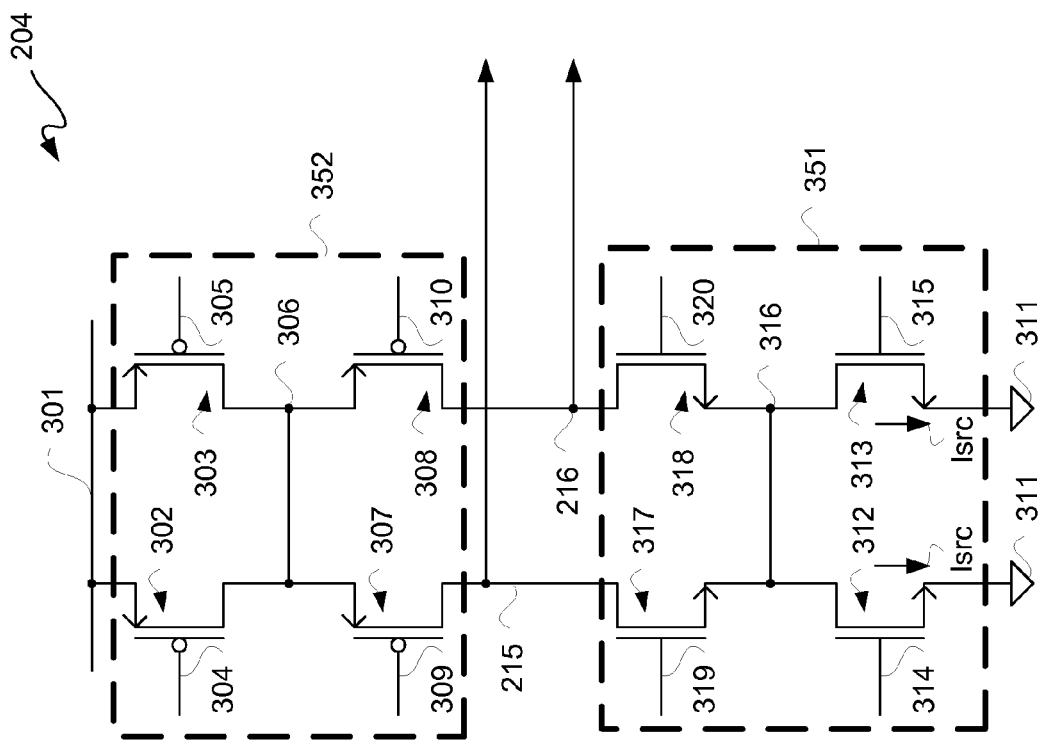
FIG. 4 is a circuit diagram depicting an exemplary embodiment of a differential driver.

FIG. 4 is a circuit diagram depicting an exemplary embodiment of differential driver 204. Differential driver 204 includes a PMOS pull-up circuit portion 352 and NMOS pull-down circuit portion 351. With simultaneous reference to FIGS. 3 and 4, differential driver 204 is further described.

PMOS pull-up circuit 352 is formed of PMOS transistors 302, 303, 307, and 308. For differential driver 204 operating in an NMOS open-drain current mode, PMOS transistors 302, 303, 307, and 308 are put in a nonconductive or substantially nonconductive state ("OFF") by providing a logic high signal to the respective gates thereof.

Source nodes of transistors 302 and 303 are coupled to supply voltage bus 301. Gates of transistors 302 and 303 respectively receive p-bias signals 304 and 305, which in an NMOS open-drain current mode may be at a VCCO voltage level, so transistors 302 and 303 are OFF. Drain nodes of transistors 302 and 303 may be coupled to a "p-common" node 306. Source nodes of transistors 307 and 308 may likewise be coupled to "p-common" node 306. Gates of transistors 307 and 308 respectively receive data signals 309 and 310; however, in an NMOS open-drain current mode may of transistors 307 and 308 are OFF, so data signals 309 and 310 may both be at a VCCO voltage level. Accordingly, it should be understood that in an NMOS open-drain current mode, data signals 309 and 310 are neither operated in complementary states, nor do they provide data. Accordingly, in an NMOS open-drain current mode, PMOS pull-up circuit 352 is OFF. Thus, with respect to a pull-up voltages at output nodes 215 and 216, such nodes are electrically floating but for being coupled to a receiver chip, such as receiver chip 330 of FIG. 3.

NMOS pull-down circuit 351 is formed of NMOS transistors 312, 313, 317, and 318. NMOS transistors 312 and 313 have their source nodes coupled to ground 311. N-bias signals 314 and 315 are respectively provided to the gates of transistors 312 and 313. N-bias signals 314 and 315 may be the same signal, and for purposes of clarity by way of example and not limitation, it shall be assumed that n-bias signals 314 and 315 are the same signal.

Voltage level of n-bias signals 314 and 315 may be used to determine a total current of current sources 312 and 313. In an NMOS open-drain current mode, transistors 312 and 313 are effectively current sources. The source current indirectly effects output signal voltage swing. More particularly, the source current of current source transistors 312 and 313 may be multiplied by a receiver termination resistance in order to determine an output voltage difference or swing ("VOD"), namely, VOD=Isrc*R, where R is the receiver termination resistance, such as resistance of either of the termination resistances 331 and 332, and Isrc is a source current flowing through a current source, such as either of transistors 312 and 313, respectively. For purposes of clarity by way of example and not limitation, an exactly balanced circuit is assumed; however, in other embodiments, it should be understood that source current may not be exactly equal as flowing through transistors 312 and 313, and likewise resistances of resistors 331 and 332 may not be exactly equal.

Drain nodes of transistors 312 and 313 respectively are coupled to n-common node 316. Source nodes of transistors 317 and 318 are likewise coupled to n-common node 316. Transistors 317 and 318 provide drive for switching transistors for driving differential voltages onto output nodes 215 and 216, respectively. Data signals 319 and 320 respectively provided to the gates of transistors 317 and 318 have complementary logic states with respect to one another in an NMOS open drain mode of operation.

For example, to have differential driver 204 drive a logic high output, data signal 319 may be logic low and data signal 320 may be logic high. In such a state, transistor 317 is in an OFF state and transistor 318 is in a conductive or substantially conductive state ("ON"). Thus, current is steered through output node 216. As a result, node 215 is at a receiver side supply voltage level ("VCCO_RX"), while output node 216 is at a lower voltage level, namely VCCO_RX minus VOD. For example, to have differential driver 204 drive a logic low output, data signal 320 may be at a logic low level and data signal 319 may be at a logic high level. Accordingly, transistor 318 is OFF, and transistor 317 is ON. In such a state, current is steered through output node 215. As a result, output node 216 or pin N is at VCCO_RX, while output node 215 or pin P is at VCCO_RX minus VOD.

Figure 5:
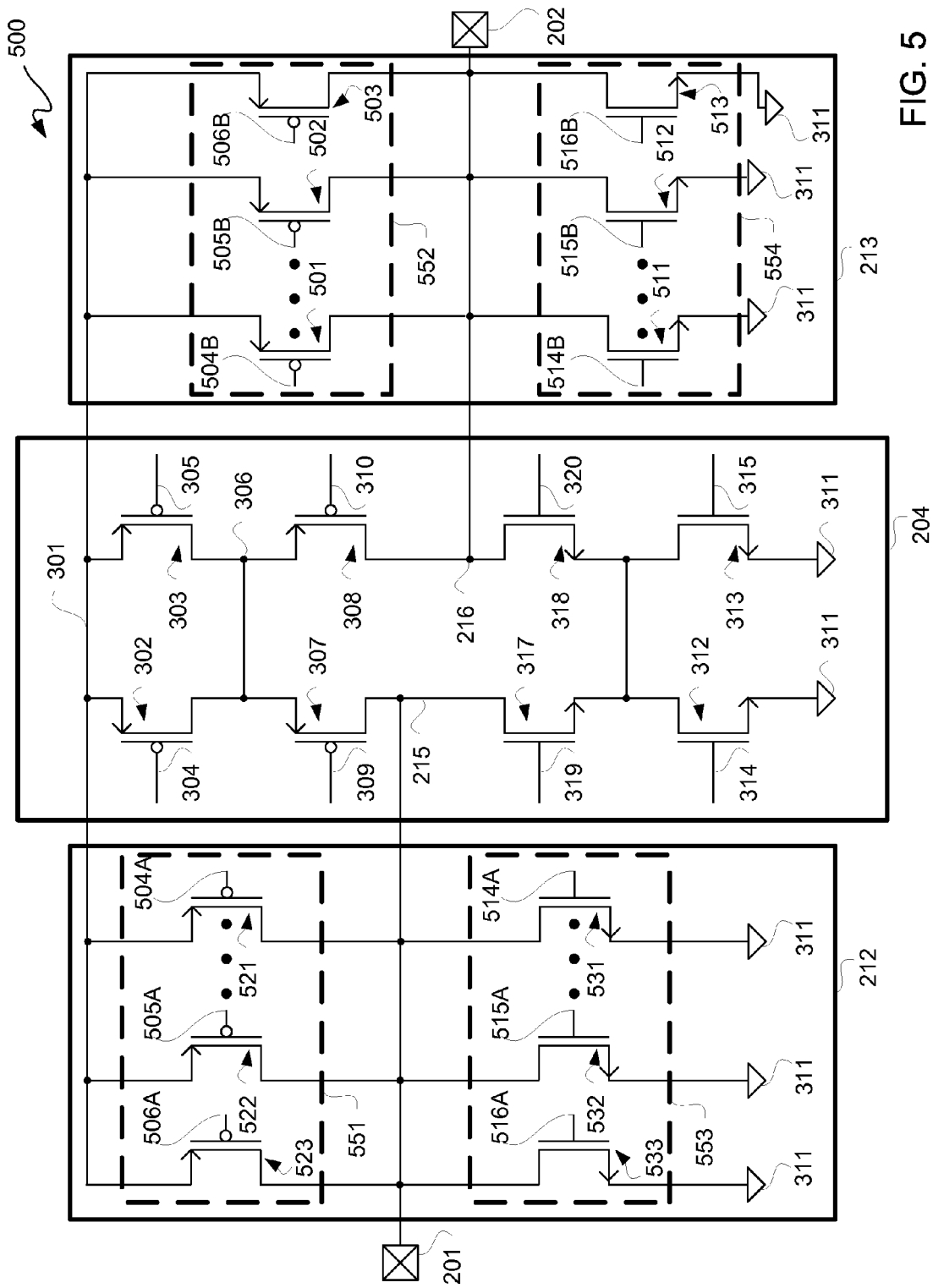
FIG. 5 is a block/circuit diagram depicting an exemplary embodiment of the differential output driver.

FIG. 5 is a block/circuit diagram depicting an exemplary embodiment of a differential output driver 500, namely differential driver 204 of FIG. 4 with single-ended output drivers 212 and 213 coupled thereto. Differential output driver 500 is described below as being in an NMOS open-drain current mode, even though a PMOS open drain current mode may be used.

Differential output driver 500 includes single-ended drivers 212 and 213 and differential driver 204. However, single-ended output drivers 212 and 213 are not used as drivers but are used as respective programmable or settable resistances, as described below in additional detail. With simultaneous reference to FIGS. 3 and 5, differential output driver 500 is further described.

A VCCO_RX voltage level at node 371 is assumed to equal a VCCO voltage level at supply voltage bus 301 for purposes of clarity and not limitation. Because receiver chip 330 in this exemplary embodiment has 50 ohm terminated inputs, which are terminated to VCCO_RX routed with 50 ohm transmission lines 361 and 362, source termination at output driver 500 for this exemplary embodiment may be 50 ohms terminated to VCCO. Again, though example resistances are used, it should be understood that other resistances may be used.

Trimming source termination resistance to exactly match the 50 ohm impedance may be used to avoid or at least minimize reflection along transmission lines 361 and 362. By matching on-chip source termination impedance with transmission line impedance, it should be understood that a reflection coefficient at an output driver end is at least reduced if not minimized for an embodiment. Furthermore, it should be understood that by lowering a reflection coefficient of differential output driver 500, signal integrity of signals passing via transmission lines 361 and 362 may be enhanced.

For an NMOS open-drain current mode, PMOS transistors of single-ended drivers 212 and 213 are used for source termination impedances and NMOS transistors of single-ended drivers 212 and 213 are turned OFF.

Single-ended driver 212 includes PMOS transistors 551 and NMOS transistors 553, and single-ended driver 213 includes PMOS transistors 552 and NMOS transistors 554. More particularly, single-ended driver 212 includes PMOS transistors 521 through 523 and NMOS transistors 531 through 533, and single-ended driver 213 includes PMOS transistors 501 through 503 and NMOS transistors 511 through 513. Even though three NMOS and PMOS transistors are shown for each of single-ended drivers 212 and 213, it should be understood that fewer or more of each of these transistors may be used and may be coupled as described below in additional detail.

Source nodes of NMOS transistors 553 are coupled to ground node 311, and source nodes of NMOS transistors 554 are coupled to ground node 311. Drain nodes of transistors 553 are coupled to output node 215, which is also coupled to I/O pad 201. Drain nodes of transistors 554 are coupled to output node 216, which is also coupled to I/O pad 202.

Source nodes of transistors 551 are coupled to supply voltage bus 301, and source nodes of transistors 552 are coupled to supply voltage bus 301. Drain nodes of transistors 551 are coupled to output node 215, as well as coupled to I/O pad 201. Drain nodes of transistors 552 are coupled to output node 216, as well as to I/O pad 202.

Gates of transistors 531 through 533 and 511 through 513 respectively receive signals 514A through 516A and 514B through 516B (collectively "gating signals 514 through 516"). Gating signals 514 through 516 may be for resistance trimming. For an NMOS open-drain current mode, all of gating signals 514 through 516 are at a logic low level such that transistors 531 through 533 and 511 and 513 are all OFF.

Gating signals 504A through 506A and 504B through 506B are respectively provided to transistors 521 through 523 and 501 through 503. It should be understood that single-ended drivers 212 and 213 may be trimmed independently of one another, and thus separate sets of gating signals for transistors thereof are illustratively depicted.

It should be understood that transistors 551 and 552 provide "PMOS legs" for impedance trimming in an NMOS open-drain current mode. It should further be understood that transistors 551 through 554 may be a weighted sequence with progressively increasing resistances, such as binarily weighted for example. Thus, for example, each of transistors 521 through 523 may provide a different increment of impedance when in an ON state, such as 0.5, 1, 2, or 1, 2, 4, or some other binary weighting sequence. If there were five transistors legs, such binary weighting may be extended, such as 1, 2, 4, 8, 16 for example. Accordingly, it should be understood that more than three transistors may be used to have a larger selection of binarily weighted impedances from which to select.

As described above, gating signals 504 through 506 respectively gate PMOS transistors of transistors 551 and 552. One or more of signals 504 through 506 may be asserted in any combination sufficient to trim source termination resistance associated with a particular output node so as to more closely match transmission line impedance to a reduce reflection coefficient.

To recapitulate, a differential driver 204 is coupled to single-ended drivers 212 and 213, which are respectively coupled at output nodes 215 and 216 of such differential driver 204. Single-ended driver 212 is used to provide a source termination resistance or impedance for an open-drain node of differential driver 204 as associated with output node 215, and single-ended driver 213 is used to provide a source termination resistance for an open-drain node of differential driver 204 associated with output node 216. Resistance or impedance trimming or setting signals 504 through 506 are provided to single-ended drivers 212 and 213, which may be trimmed independently of one another. It should be understood that single-ended drivers 212 and 213 due to process variation for example, may not be exactly equivalent. So, rather than a same set of resistance setting signals provided to both of such single-ended drivers, it should be understood that different setting signals may be provided to provide to single-ended drivers 212 and 213 to provide more variability to handle process differences. Optionally, single-ended drivers 212 and 213 may be trimmed with a same set of signals, for example where gating signals 504A through 506A are respectively the same as gating signals 504B through 506B.

Furthermore, it should be understood that differential driver 204 may be a low-voltage differential signaling ("LVDS") driver having a pull-up portion and a pull-down portion as previously described with reference to FIG. 3, and either such pull-up portion or pull-down portion may be turned off for an open-drain current mode. As described herein, for an NMOS open-drain current mode, a pull-down portion is ON while a pull-up portion is OFF for such differential driver 204, and in such mode, NMOS transistors of single-ended drivers 212 and 213 are OFF while one or more PMOS transistors of each of single-ended drivers 212 and 213 may be ON. For a PMOS open drain current mode, the opposite polarity with respect to the above description is used. It should further be understood that each single-ended driver has a pair of PMOS and NMOS transistors which pairs collectively form PMOS and NMOS legs, respectively. It should further be understood that each set of PMOS and NMOS transistors 551 through 554 may have a same binary weighted resistance progression.

Accordingly, it should be understood that by manipulating single-ended output drivers as programmable on-chip source termination resistances, slew rate of an associated differential output driver may be enhanced. In other words, with on-chip source termination tuned to more closely match transmission line impedance, an "eye" diagram associated with transmission via such differential output driver may indicate an improvement in the opening of such "eye." It is estimated that at least a 10% improvement in the opening of an eye diagram may be obtained, and such improvement may exceed 20%, as compared to an equivalent chip without such trimmed on-chip source termination. It should further be understood that the ability to trim on-chip source termination without significantly increasing circuit complexity provides additional degrees of freedom for yielding parts.

In an exemplary embodiment, a combination of binarily weighted PMOS legs may be obtained through silicon characterization by measuring current-voltage ("IV") curves for each of such PMOS legs, namely each of transistors 521 through 523 and 501 through 503. Such PMOS legs may be programmed to differential output driver 500 via software bit settings. In such an implementation, a user may not have to fine tune or trim source termination impedances, as such trimming may be done at the factory. Such an implementation may provide a low cost alternative for high-speed serial interfaces where transmission signal integrity is relevant, such as high definition multimedia interfaces for example, as previously described. However, as is known, impedance may vary with process, voltage, and/or temperature ("PVT") variation. Thus, a fixed factory setting for each die may not sufficiently take into account some PVT variation.

Figure 6:
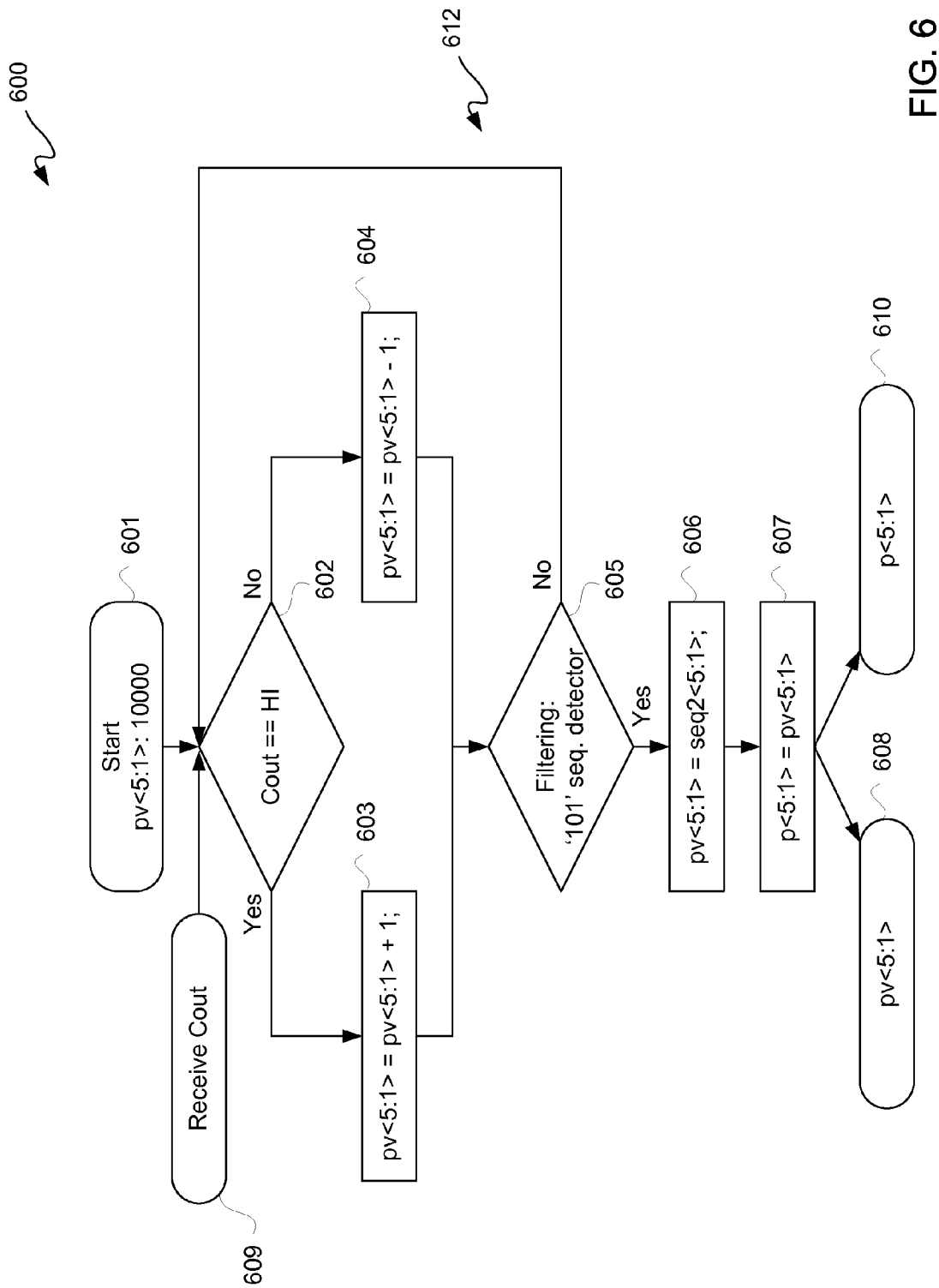
FIG. 6 is a flow diagram depicting an exemplary embodiment of a calibration flow.
Figure 7:
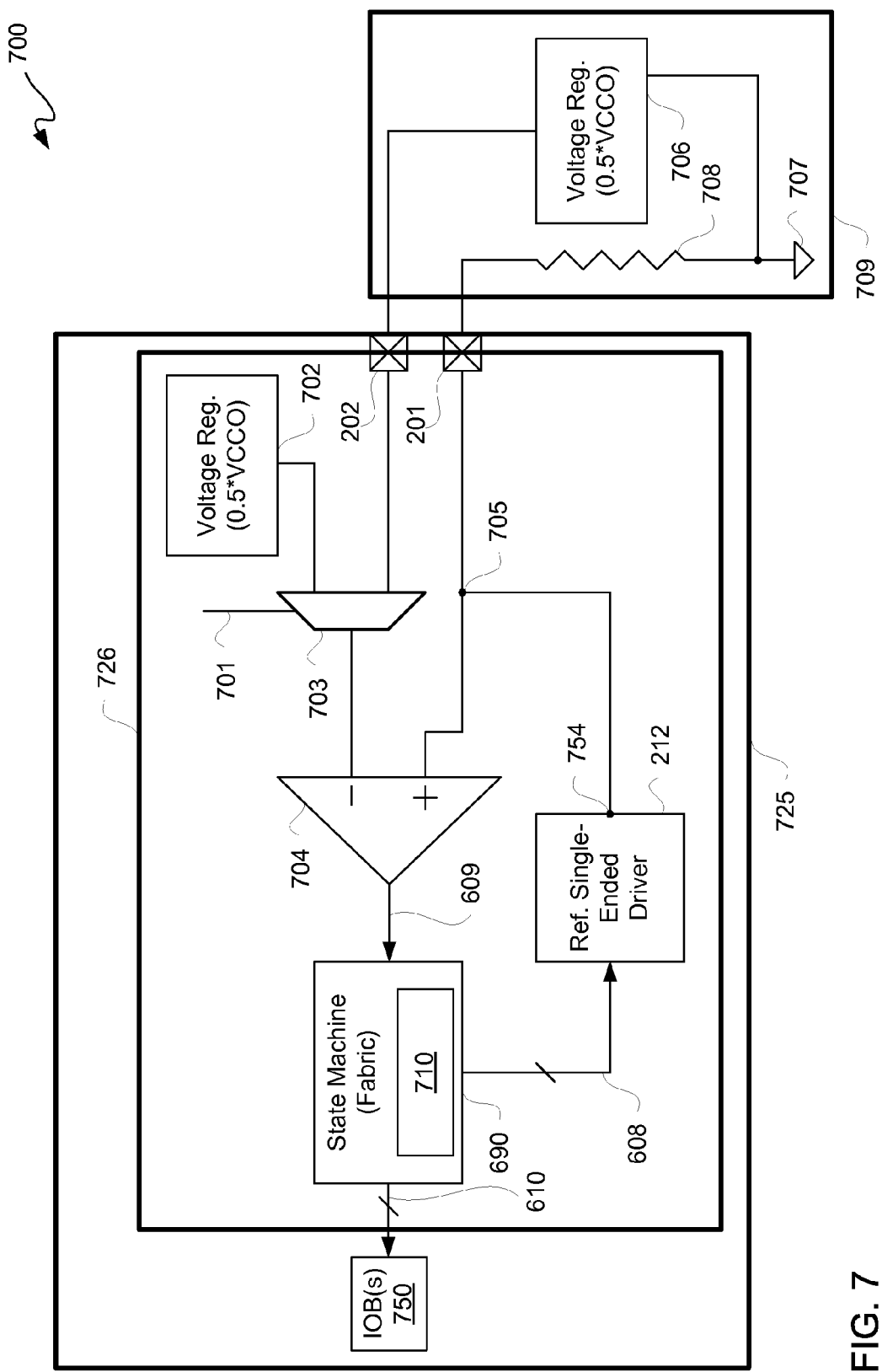
FIG. 7 is a block/circuit diagram depicting an exemplary embodiment of a calibration system.
Figure 8:
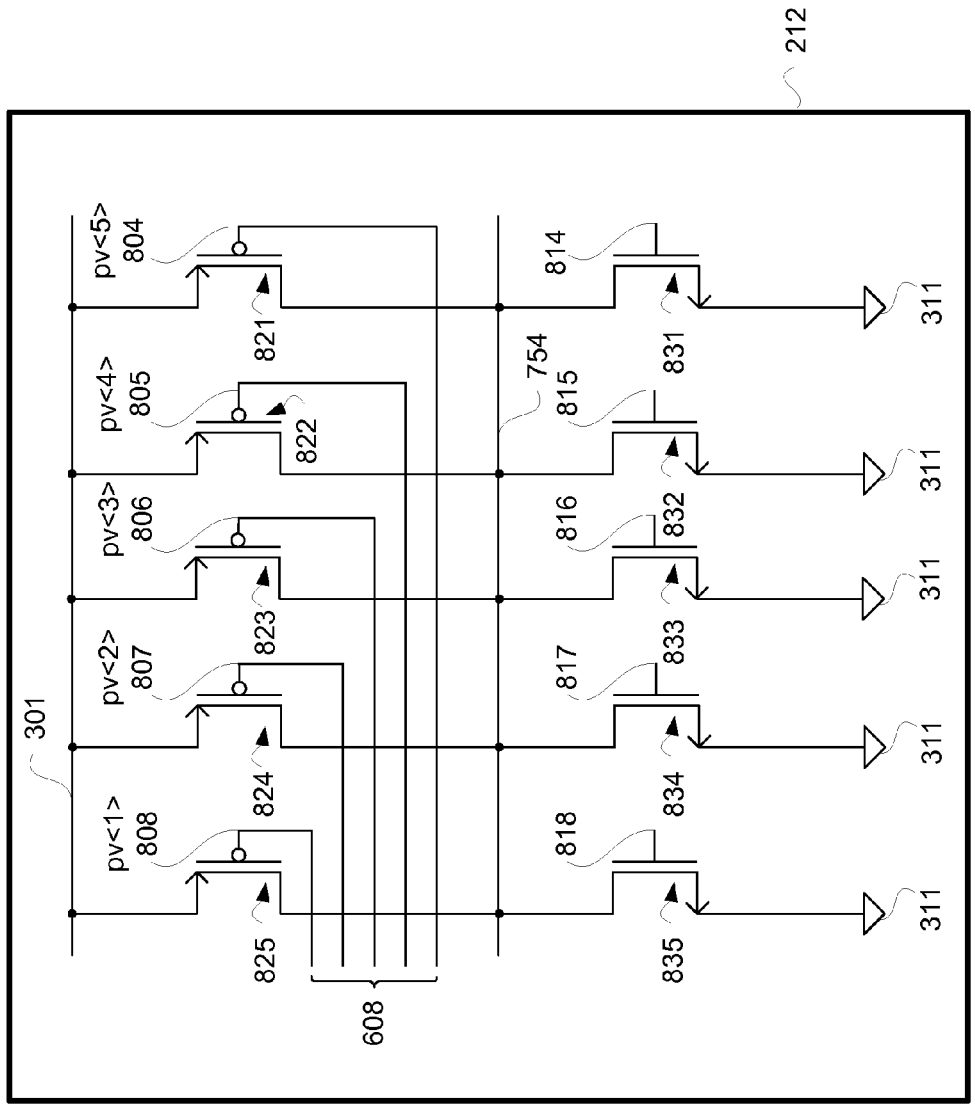
FIG. 8 is a circuit diagram depicting an exemplary embodiment of a reference single-ended driver.

FIG. 6 is a flow diagram depicting an exemplary embodiment of a calibration flow 600. FIG. 7 is a block/circuit diagram depicting an exemplary embodiment of a calibration system 700 having a state machine 690, where state machine 690 implements calibration flow 600 of FIG. 6. FIG. 8 is a circuit diagram depicting an exemplary embodiment of a reference single-ended driver 212, which for purposes of clarity is designated as reference single-ended driver 212 corresponding to reference single-ended driver 212 of FIGS. 2, 5, and 7. Again for purposes of clarity by way of example and not limitation, an NMOS open-drain current driver is described; however, it should be understood that a PMOS open-drain current driver could be used. Furthermore, it should be understood that reference single-ended driver 212 is calibrated using PMOS legs instead of NMOS legs for an NMOS open-drain current mode where such precision resistances are terminated to VCCO of supply voltage bus 301. With simultaneous reference to FIGS. 6 through 8, system 700 is further described.

As shown in FIG. 7, off chip region 709 includes a voltage regulator 706 and a resistor 708. For purposes of clarity by way of example and not limitation, it shall be assumed that resistor 708 is a 50 ohm resistor, and that resistor 708 and voltage regulator 706 are separate components. Furthermore, for purposes of clarity by way of example and not limitation, it shall be assumed that voltage regulator 706 produces a voltage which is VCCO/2 or 0.5*VCCO.

Resistor 708 and voltage regulator 706 are coupled to a ground 707. Furthermore, resistor 708 is coupled to I/O pad 201 of integrated circuit chip 725, and voltage regulator 706 is coupled to I/O pad 202 of integrated circuit chip 725. Integrated circuit 725 includes IOBs 750 coupled to a reference IOB circuit 726. For purposes of clarity by way of example and not limitation, I/O pads 201 and 202 are described with reference to reference IOB circuit 726; however, it should be understood that IOBs 750 are a plurality of IOBs 200 having respective sets of I/O pads. Thus, IOBs 750 referenced to reference IOB circuit 726 may provide an output interface.

Optionally, rather than having an off-chip voltage regulator 706, an internal voltage regulator 702 of chip 725 may be used, and optionally such voltage regulator 702 may be part of reference IOB circuit 726. Voltage regulator 702 likewise produces a regulated voltage which is VCCO*0.5. Optionally, output of internal voltage regulator 702 and output of external voltage regulator 706 may each be provided as respective inputs to a multiplexer 703 which, responsive to a control select signal 701, may select either the internal regulated voltage or the external regulated voltage for output from multiplexer 703. For purposes of clarity by way of example and not limitation, it shall be assumed that multiplexer 703 and both internal and external voltage regulators are present. However, it should be understood that multiplexer 703 may be eliminated in a single voltage regulator, external or internal, embodiment.

Output of multiplexer 703 is provided to a minus port of comparator 704. A plus port of comparator 704 is coupled to I/O pad 201 via a reference node 705. Comparator 704 is to compare a reference voltage and a regulated voltage to provide a comparison output, namely comparison output 609. Thus, it should be understood that a reference voltage is obtained at reference node 705, as described below in additional detail.

Output 609 of comparator 704 is provided to state machine 690. State machine 690 in an embodiment may be instantiated using programmable resources of a PLD, such as an FPGA. However, it should be understood that state machine 690 may be implemented in dedicated logic resources or a combination of programmable and dedicated logic resources. For purposes of clarity by way of example and not limitation, it shall be assumed that chip 725 is a PLD, such as an FPGA; however, it should be appreciated that any type of integrated circuit chip used for transmission of data via an output driver may include reference IOB circuit 726. State machine 690 is coupled to comparator 704 to increment or decrement a resistance setting output 608 of state machine 690 responsive to comparison output 609.

A reference single-ended driver 212 is coupled to receive resistance setting output 608 from state machine 690. An output node 754 of such reference single-ended driver 212 is coupled to reference node 705. Reference voltage input from reference node 705 to comparator 704 may be a feedback voltage sourced from reference single-ended driver 212. Referring to FIG. 8, it should be understood that output node 754 of single-ended reference driver 212 may be a common drain node of PMOS and NMOS transistors, as described below in additional detail with reference to FIG. 8.

Either an NMOS portion or PMOS portion of a reference single-ended driver is shut OFF depending upon whether a PMOS or an NMOS open drain current mode is used. It should be understood that in an embodiment of reference IOB circuit 726, where either a dedicated NMOS open-drain current mode or PMOS open-drain current mode is to be used, reference single-ended driver 212 may optionally only have either NMOS or PMOS transistors. However, for purposes of clarity by way of example and not limitation, it shall be assumed that reference single-ended driver 212 is obtained from an IOB of integrated circuit 725, which is effectively the same as any of IOBs 750.

For an open drain current mode, transistors of reference single-ended driver 212 are set to either in an ON state or an OFF state responsive to resistance setting output 608 to provide an internal source termination resistance as a reference resistance. For an NMOS open-drain current mode, resistance setting output 608 is provided to gates of PMOS transistors of reference single-ended driver 212. However, for a PMOS open-drain current mode, resistance setting output 608 may be provided to gates of NMOS transistors of reference single-ended driver 212.

In this embodiment, reference single-ended driver 212 may be a "sacrificial" single-ended driver of an IOB in order to provide resistance setting output 610 to single-ended drivers of IOBs 750. In other words, an IOB is used in part to provide reference IOB circuit 726.

Resistance setting output 610 from state machine 690, which may be the same as resistance setting output 608, may be provided to single-ended drivers of IOBs 750 as previously described with reference to FIG. 5. Thus, each of IOBs 750 may have their source termination resistances trimmed according to output from state machine 690. Again, each of IOBs 750 may be the same as IOB 200 of FIG. 2, and as described with reference to FIGS. 3, 4, and 5, and by using a sacrificial IOB for reference IOB circuit 726, IOBs 750 may more closely correspond with reference single-ended driver 212.

State machine 690 is configured to decrement resistance of resistance setting output 608 and 610 when comparison output 609 indicates that reference voltage at reference node 705 is greater than regulated voltage output from multiplexer 703. State machine 690 is further configured to increment resistance of resistance setting output 608 and 610 responsive to comparison output 609 indicating that reference voltage at reference node 705 is less than regulated voltage output from multiplexer 703.

For this exemplary embodiment (see FIG. 6), calibration flow 600 starts at 601, where a PMOS voltage setting is incremented or decremented starting at the middle, namely 10000, of a five bit range. Starting in the middle position of a range of resistance settings allows state machine 690 to be initialized to a resistance value that is more likely to be closer than starting at a 0 resistance value. In other words, state machine 690 is initiated at a middle resistance value of the range of possible resistances of reference single-ended driver 212 with respect to PMOS legs for this exemplary embodiment. Starting in the middle of such a range may effectively reduce the number of calibration cycles before reaching concluding state.

Comparator ("comparison") output 609 is received by state machine 690, and at 602 it is determined whether such comparison output 609 is logic high. Optionally, a logic low detection for comparison output 609 may be used.

If at 602 it is determined that comparison output 609 is logic high, then at 603 the present resistance setting is incremented by one. If, however, it is determined at 602 that comparison output 609 is not logic high, namely logic low, then at 604 the present resistance setting is decremented by one.

From either 603 or 604, at 605 it is determined whether a 101 filtering sequence is detected. Even though a 101 filtering sequence is used for detecting whether loop 612 is toggling between increment and decrement operations, other filtering sequences may be used, such as 010, or some other repetitive filtering sequence.

If a 101 sequence is not detected at 605, then loop 612 returns to 602 to receive a next comparison output 609. If, however, at 605 a 101 sequence is detected, then at 606 a middle or second sequence ("seq2") is set equal to the present resistance setting, which for an NMOS open drain current mode is indicated as a p-type transistor voltage ("pv").

It should be understood that at 605, a number of sequences may be stored. For example, a first sequence <4:0>, a second sequence <4:0>, and a third sequence <4:0> may be stored as a stack of sequences for iterations of loop 612. Even though an example of three sequences is used, fewer or more sequences may be stored at 605. One of such sequences may be set equal to the present resistance setting of loop 612 at 606. Even though a middle sequence, namely sequence 2 is illustratively depicted in FIG. 6, it should be understood that any of the sequences stored at 605 may be used.

At 607, a p-type reference resistance setting set at 606 is set equal to a p-type resistance setting. The p-type resistance setting may be output as resistance setting 610 for IOBs 750, and the p-type reference resistance setting 608 may be output to reference single-ended driver 212. Optionally, a single bit setting, and thus a single signal bus, may be used for both of resistance settings signals 608 and 610.

Resistance setting signal 608 may be multiple bits, which in this exemplary embodiment is depicted as a five bit signal. However, fewer or more bits may be used, which may scale with the number of PMOS, or NMOS, legs implemented in reference single-ended driver 212 (see FIG. 8).

Bits of reference setting signal 608 are respectively provided to gates of PMOS transistors 821 through 825 of reference single-ended driver 212. More particularly, p-type reference resistance setting signals 804 through 808 are respectively provided to gates of transistors 821 through 825. Source nodes of transistors 821 through 825 are coupled to supply voltage bus 301. Drain nodes of transistors 821 through 825 are coupled to reference node 705. As reference single-ended driver 212 may be obtained from a sacrificial IOB for such reference IOB circuit 726, there may be NMOS transistors in addition to PMOS transistors, as previously described, in pairs. Accordingly, NMOS transistors 831 through 835 may have their gates respectively coupled to receive signals 814 through 818. In an NMOS open-drain current mode, signals 814 through 818 are all logic low, and consequently transistors 831 through 835 are OFF. Source nodes of transistors 831 through 835 may be coupled to ground 311, and drain nodes of transistors 831 through 835 may be coupled to reference node 750.

It should be understood that zero, one, or more of transistors 821 through 825 may be ON responsive to output reference setting signal 608. In this exemplary embodiment, at most all five of transistors 821 through 825 may be ON at a time. The resistance provided by those of transistors 821 through 825 in an ON state responsive to those associated signals of output reference setting signal 608 in a logic low state may be thought of as an effective resistance or $R_{eff}$. Resistance of resistor 708 may be thought of as a reference resistance or $R_{ref}$. Thus, the voltage provided at reference node 705 is the reference input voltage, namely VCCO multiplied by the reference resistance divided by the sum of the reference resistance plus the effective resistance, namely: Vref=(VCCO) [$R_{ref}/(R_{ref}+R_{eff})$].

Again, by initializing state machine 690 with a 10000 binary format, where the five bit positions are associated in this exemplary embodiment with five PMOS transistors 821 through 825, respectively, for an NMOS open-drain current mode, the initial binary combination effectively reduces the number of calibration cycles. It should be understood that in this exemplary embodiment a logic 1 represents a logic high as applied a PMOS transistor of transistors 821 through 825, and thus such transistor would be turned OFF. Moreover, a logic 0 represents a logic low as applied to a PMOS transistor of PMOS transistors 821 through 825, and thus such PMOS transistor would be ON.

Comparison output signal 609 is at a logic high when voltage level of reference node 705 is greater than VCCO/2. For comparison output 609 being a logic high means that reference single-ended driver 212 has a PMOS resistance of less than 50 ohms in this exemplary embodiment. Accordingly, state machine 690 is configured to increment resistance, namely effectively increment a counter by one. Thus, it should be understood that state machine 690 in an implementation may include a counter which is incremented and decremented. Additionally, because sequences may be stored, state machine 690 may include registers for storing one or more sequences. Circuitry, such as registers and a counter, for implementing state machine is generally depicted as block 710 of state machine 690.

Comparison output 609 is logic low when voltage level at reference node 705 is less than VCCO/2. Comparison output 609 being logic low means that single-ended driver 212 PMOS resistance is greater than 50 ohms in this exemplary embodiment. Accordingly, state machine 690 decreases count, such as of a counter, by one to decrement resistance.

Calibration cycles, namely cycles of loop 612, may continue until a filtering block, generally depicted as decision block 605, detects that the p-type voltage resistance setting sequences are fluctuating within a single step of resolution. For example, if such resistance setting at cycle N is 01011, and at cycle N+1 such resistance setting is 01010, and at cycle N+2 such resistance setting is 01011, it should be understood that fluctuations are a single step of resolution. In this exemplary embodiment, once sequences are recognized to be within a single step of resolution, the sequence associated with a middle cycle, namely N+1 cycle, is programmed to IOBs 750 responsive to resistance setting output 610 bits. However, a user need not perform one calibration, but rather a user may determine how frequent calibration is to be used, which may vary from application-to-application depending on usage model.

To recapitulate, a reference voltage and a regulated voltage may be compared, and the result of such comparisons may be tracked, namely tracking of state, to either increment or decrement a resistance setting. In short, the resistance setting is incremented or decremented responsive to the comparing. Resistance setting signals may be output responsive to the resistance setting. Again, state machine 690 may be instantiated in programmable resources for the tracking, the incrementing, the decrementing, and the outputting as described herein.

Figure 9:
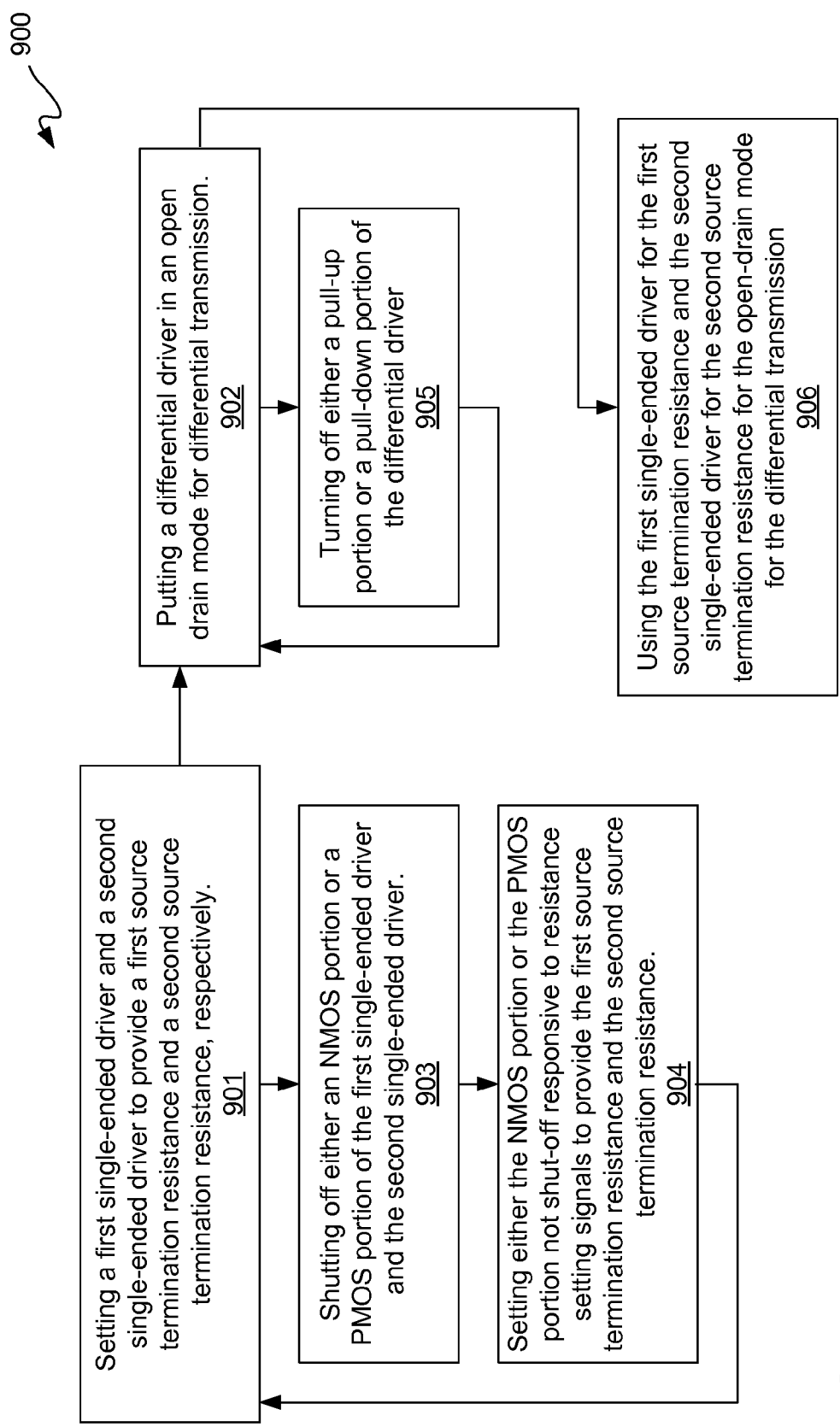
FIG. 9 is a flow diagram depicting an exemplary embodiment of a process for operating an output driver having a differential driver.

FIG. 9 is a flow diagram depicting an exemplary embodiment of a process 900 for operating an output driver having a differential driver. At 901, a first single-ended driver and a second single-ended driver are set to provide a first source termination resistance and a second source termination resistance, respectively.

In order to perform the setting described at 901, operations at 903 and 904 may be performed. At 903, either an NMOS portion or a PMOS portion of the first single-ended driver and the second single-ended driver is shut OFF. For an NMOS open drain current mode, the NMOS portion is shut off, the PMOS portion acts as source termination, and for a PMOS open-drain current mode, the PMOS portion is shut off, the NMOS portion acts as source termination at 903. At 904, either the NMOS portion or the PMOS portion not shut OFF is set to provide the first source termination resistance and the second source termination resistance responsive to resistance setting signals.

At 902, a differential driver may be put in an open-drain current mode for differential transmission. Depending on whether a PMOS or an NMOS open-drain current mode is used, at 905 either a pull-up portion or a pull-down portion of the differential driver is turned OFF for putting such differential driver in an open-drain mode at 902. After turning off either a pull-up portion or a pull-down portion of such differential driver at 905, at 902, such differential driver is put in a corresponding selected open-drain current mode, whether an NMOS open-drain current mode or a PMOS open-drain current mode.

At 906, with such differential driver in an open-drain current mode from 902, the first single-ended driver is used for the first source termination resistance and the second single-ended driver is used for the second source termination resistance for such open drain current mode for the differential transmission at 906.

Accordingly, it should be understood that differential output driver, by manipulating single-ended output drivers as programmable on-chip source termination resistances may be used to enhance slew rate of such differential output driver.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. An integrated circuit for an output interface, comprising:
a comparator to compare a reference voltage and a regulated voltage to provide a comparison output;
a state machine coupled to the comparator to increment or decrement a resistance setting output of the state machine responsive to the comparison output;
a reference single-ended driver including a pull-up portion and a pull-down portion, the reference single-ended driver being coupled to receive the resistance setting output from the state machine; and
an output node of the reference single-ended driver coupled to a reference node from which the reference voltage is input to the comparator as a feedback voltage;
wherein transistors of the reference single-ended driver are set to be in either at least a substantially conductive state or at least a substantially non-conductive state responsive to the resistance setting output to provide an internal source termination resistance as a reference resistance.

2. The integrated circuit according to claim 1, further comprising:
a plurality of output drivers coupled to receive the resistance setting output from the state machine;
wherein the resistance setting output includes first resistance setting signals and second resistance setting signals, and each of the plurality of output drivers includes:
a differential driver;
a first single-ended driver including a pull-up portion and a pull-down portion, the reference single-ended driver being coupled to the differential driver at a first output node common to the first single-ended driver and the differential driver; and
a second single-ended driver including a pull-up portion and a pull-down portion, the reference single-ended driver being coupled to the differential driver at a second output node common to the second single-ended driver and the differential driver;
wherein the first single-ended driver receives the first resistance setting signals to provide a first source termination resistance for an open-drain mode of the differential driver; and
wherein the second single-ended driver receives the second resistance setting signals to provide a second source termination resistance for the open-drain mode of the differential driver.

3. The integrated circuit of claim 2, wherein:
the differential driver is a low-voltage differential signaling driver having a pull-up portion and a pull-down portion; and
either the pull-up portion or the pull-down portion is turned off for an open-drain mode.

4. The integrated circuit of claim 2, wherein:
each first single-ended driver and each second single-ended driver includes drain-to-drain coupled pairs of PMOS and NMOS transistors;
drain nodes of the pairs of PMOS and NMOS transistors of each first single-ended driver are coupled to the first output node; and
drain nodes of the pairs of PMOS and NMOS transistors of each second single-ended driver are coupled to the second output node.

5. The integrated circuit of claim 4, wherein:
NMOS transistors of the pairs of PMOS and NMOS transistors of each first single-ended driver and each second single-ended driver provide respective first binary weighted resistance progressions; and
PMOS transistors of the pairs of PMOS and NMOS transistors of each first single-ended driver and each second single-ended driver provide respective second binary weighted resistance progressions.

6. The integrated circuit of claim 2, wherein:
each first single-ended driver is configurable to provide the first source termination resistance of a first plurality of programmable resistance settings;
each second single-ended driver is configurable to provide the second source termination resistance of a second plurality of programmable resistance settings; and
the first source termination resistance and the second source termination resistance are configurable independent of one another.

7. The integrated circuit of claim 2, wherein:
each first single-ended driver is configurable to provide the first source termination resistance of a first plurality of programmable resistance settings in response to the first resistance setting signals; and
each second single-ended driver is configurable to provide the second source termination resistance of a second plurality of programmable resistance settings in response to the second resistance setting signals.

8. The integrated circuit according to claim 1, wherein the state machine is configured to:
decrement resistance of the resistance setting output for the comparison output indicating that the reference voltage is greater than the regulated voltage; and
increment resistance of the resistance setting output for the comparison output indicating that the reference voltage is less than the regulated voltage.

9. The integrated circuit according to claim 1, wherein the state machine is instantiated in programmable resources.

10. The integrated circuit according to claim 1, wherein the reference single-ended driver is of an output driver.

11. The integrated circuit according to claim 10, wherein:
the regulated voltage is an internally supplied voltage; and
the reference node is coupled to an external resistor.

12. The integrated circuit according to claim 10, wherein:
the regulated voltage is an externally supplied voltage; and
the reference node is coupled to an external resistor.

13. The integrated circuit of claim of claim 1, wherein:
the reference single-ended driver includes drain-to-drain coupled pairs of PMOS and NMOS transistors; and
drain nodes of the pairs of PMOS and NMOS transistors of the reference single-ended driver are coupled to the output node.

14. The integrated circuit of claim 13, wherein:
NMOS transistors of the pairs of PMOS and NMOS transistors of the reference single-ended driver provide respective first binary weighted resistance progressions; and PMOS transistors of the pairs of PMOS and NMOS transistors of the reference single-ended driver provide respective second binary weighted resistance progressions.

15. The integrated circuit of claim 1, wherein the state machine is configured to begin with a resistance of the resistance setting output that is a middle value of an n-bit range of values for n>2.

16. The integrated circuit of claim 1, wherein the state machine is implemented in dedicated logic resources.

17. A method of operating an output interface, comprising:
   comparing a reference voltage and a regulated voltage in a comparator to provide a comparison output;
   incrementing or decrementing a resistance setting output of a state machine responsive to the comparison output;
   setting one or more transistors of a reference single-ended driver, including a pull-up portion and a pull-down portion, to be in either at least a substantially conductive state or at least a substantially non-conductive state responsive to the resistance setting output to provide an internal source termination resistance as a reference resistance; and
   outputting the reference voltage to the comparator as a feedback voltage.

18. The method of claim 17, further comprising:
   initiating the state machine to a middle position of a range of possible resistance settings.

19. The method of claim 17, further comprising:
   determining whether a filtering sequence is detected.

20. The method of claim 19, wherein the determining whether a filtering sequence is detected comprises detecting toggling between increment and decrement operations.

* * * * *